(12) United States Patent
Azad et al.

(10) Patent No.: US 10,868,375 B2
(45) Date of Patent: Dec. 15, 2020

(54) NON-STAGGERED DUAL ROW SMT CONNECTOR

(71) Applicant: J.S.T. CORPORATION, Farmington Hills, MI (US)

(72) Inventors: Vikas Azad, Novi, MI (US); Franklin A. Holub, West Bloomfield, MI (US)

(73) Assignee: J.S.T. CORPORATION, Farmington Hills, MI (US)

( * ) Notice: Subject to any disclaimer, the term of this patent is extended or adjusted under 35 U.S.C. 154(b) by 0 days.

(21) Appl. No.: 16/016,943

(22) Filed: Jun. 25, 2018

(65) Prior Publication Data

US 2019/0013603 A1 Jan. 10, 2019

Related U.S. Application Data

(60) Provisional application No. 62/529,695, filed on Jul. 7, 2017.

(51) Int. Cl.
| | |
|---|---|
| *H01R 29/00* | (2006.01) |
| *H01R 12/57* | (2011.01) |
| *H05K 1/18* | (2006.01) |
| *H01R 13/20* | (2006.01) |
| *H01R 13/627* | (2006.01) |
| *H01R 12/58* | (2011.01) |
| *H01R 12/70* | (2011.01) |
| *H01R 12/72* | (2011.01) |

(52) U.S. Cl.
CPC ............ *H01R 12/57* (2013.01); *H01R 12/58* (2013.01); *H01R 12/7023* (2013.01); *H01R 12/722* (2013.01); *H01R 13/20* (2013.01); *H01R 13/6273* (2013.01); *H05K 1/181* (2013.01); *H01R 12/7052* (2013.01)

(58) Field of Classification Search
CPC ............... H01R 17/125; H01R 23/725; H01R 23/7073; H01R 17/12
USPC ...................................... 439/63, 74, 79, 578
See application file for complete search history.

(56) References Cited

U.S. PATENT DOCUMENTS

| | | | | |
|---|---|---|---|---|
| 3,413,594 A | * | 11/1968 | Fernald | H01R 12/727 439/637 |
| 5,310,360 A | * | 5/1994 | Peterson | H01R 12/727 439/571 |
| 5,816,831 A | | 10/1998 | Clark | |
| 6,129,572 A | * | 10/2000 | Feldman | G06K 13/08 439/325 |
| 6,500,028 B1 | | 12/2002 | Higuchi | |
| 6,663,407 B1 | * | 12/2003 | Pickles | G06K 7/0021 439/326 |

(Continued)

OTHER PUBLICATIONS

Written Opinion of the International Searching Authority for International Application No. PCT/US18/40672 dated Sep. 21, 2018 (6 sheets).

(Continued)

*Primary Examiner* — Phuong Chi Thi Nguyen
(74) *Attorney, Agent, or Firm* — Kratz, Quintos & Hanson, LLP

(57) ABSTRACT

Electrical connector apparatus can have at least two pins, at least one side slot, and at least one latch, facilitating a secure physical connection and a secure electrical connection with a printed circuit board or other unit. The electrical connector apparatus can be a non-staggered dual row surface mount terminal connector.

20 Claims, 15 Drawing Sheets

(56) References Cited

U.S. PATENT DOCUMENTS

| | | |
|---|---|---|
| 7,083,455 B1 | 8/2006 | Miura |
| 2002/0177332 A1* | 11/2002 | Hubbard ............... H01R 24/50 439/63 |
| 2008/0171471 A1 | 7/2008 | Johannes |
| 2010/0128429 A1 | 5/2010 | Tsujimoto |
| 2011/0045681 A1* | 2/2011 | Tsai ................... H01R 12/7029 439/328 |
| 2017/0069985 A1* | 3/2017 | Schulze ............. H01R 12/7029 |

OTHER PUBLICATIONS

International Search Report of the International Searching Authority for International Application No. PCT/US18/40672 dated Sep. 21, 2018 (2 sheets).

International Preliminary Report on Patentability for International Application No. PCT/US2018/040672 dated Nov. 20, 2019 (17 sheets).

\* cited by examiner

NON-STAGGERED DUAL ROW SMT CONNECTOR

CROSS-REFERENCE TO RELATED APPLICATIONS

This patent application claims priority to U.S. Provisional Patent Application No. 62/529,695, filed Jul. 7, 2017, which is hereby incorporated herein by reference in its entirety.

BACKGROUND OF THE INVENTION

The features disclosed in the subject application can generally relate to an electrical connector apparatus. In particular, the features disclosed in the subject application can generally relate to a non-staggered dual row connector for electrical connectivity in conjunction with surface mount terminal (SMT) applications.

BRIEF SUMMARY OF THE INVENTION

The features disclosed in the subject application can generally relate to an electrical connector apparatus. The electrical connector apparatus can have at least two pins, at least one slot, and at least one latch. The electrical connector apparatus can be secured to a printed circuit board, or other unit. The printed circuit board, or other unit, can have at least two terminals such that each terminal will be in electrical contact with a respective one of the at least two pins, can have at least one receiving hole for receiving the at least one latch, and can have an edge which is received by the at least one slot. The at least two pins and at least two terminals are electrically conductive.

The electrical connector apparatus can be a non-staggered dual row surface mount terminal connector. The features disclosed in the subject application can generally relate to an electrical connector apparatus known as a non-staggered dual row connector used for electrical connectivity in conjunction with surface mount terminal (SMT) applications.

The at least two pins can be of equal length. This facilitates both ease in manufacturing and use as a high-speed data connector. The pins can include an upper row of pins and a lower row of pins, for example. The upper pins can be soldered to the terminals on a top side of the printed circuit board, or other unit, for example. The lower pins can be soldered to the terminals on a bottom side of the printed circuit board, or other unit, for example.

The at least one latch permits the electrical connector apparatus to be secured to the printed circuit board, or other unit, such that the connector will not easily come off the terminals during extraction, wherein the at least one latch is received by the at least one receiving hole formed by the printed circuit board, or other unit.

Additional aspects, advantages, and embodiments of the features disclosed in the subject application are set forth in, or are apparent from consideration of, the following detailed description, drawings, and claims. Moreover, it is to be understood that both the foregoing summary of the features disclosed in the subject application, and the following detailed description, are exemplary and intended to provide further explanations without limiting the scope of the claimed invention.

DETAILED DESCRIPTION OF THE PREFERRED EMBODIMENTS

The features disclosed in the subject application can generally relate to an electrical connector apparatus. The electrical connector apparatus can have at least two pins, at least one side slot, and at least one latch. A printed circuit board, or other unit, can have at least two terminals, at least one receiving hole, and at least one edge. Each one of the terminals of the printed circuit board, or other unit, can be in electrical contact with a respective one of the at least two pins of the electrical connector apparatus. The at least one receiving hole can be received by the at least one latch. The at least one edge can be received by the at least one slot.

The electrical connector apparatus can facilitate a secure physical connection, and also a secure electrical connection, with the printed circuit board or other unit.

Figure 1:
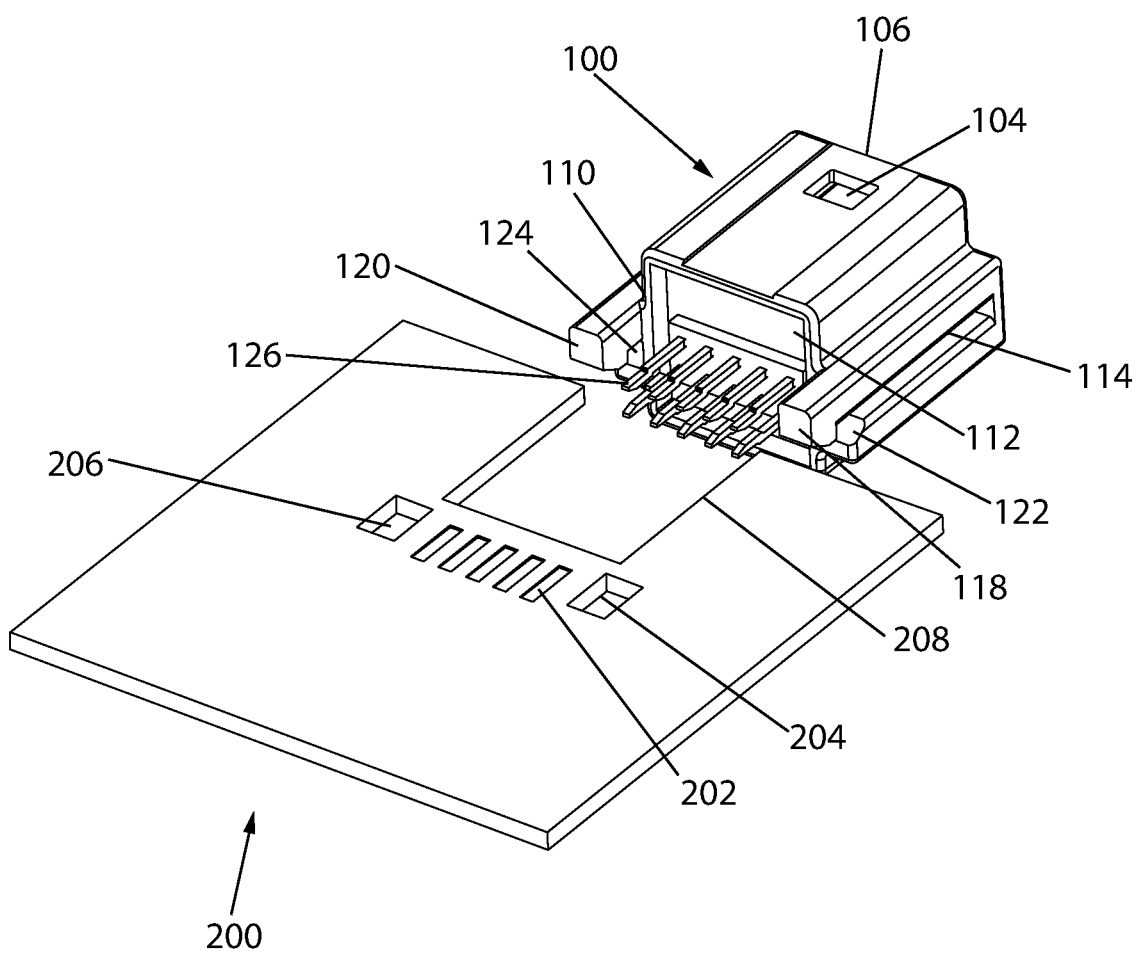
FIG. 1 is an exploded perspective view of an electrical connector apparatus and a printed circuit board (PCB), in accordance with the principles disclosed in the subject application.

FIG. 1 is an exploded perspective view of an electrical connector apparatus and a printed circuit board (PCB), in accordance with the principles disclosed in the subject application. The electrical connector apparatus can be a non-staggered dual row surface mount terminal (SMT) connector.

The electrical connector apparatus (also described as a connector herein) of the subject application is generally referred to by reference numeral 100. FIG. 1 shows a body of the connector 100, wherein a top side aperture 104 is formed on the top side of the connector 100. Reference numeral 110 indicates a front side of the connector 100, and reference numeral 106 indicates a rear side of the connector 100.

FIG. 1 shows that a first side of the connector 100 has at least a first side slot 114, a first side latch, and a first side ramp. The first side latch is generally referred to by reference numeral 118. The first side ramp is generally referred to by reference numeral 122. The first side ramp 122 is formed at an entrance to the first side slot 114.

Also, FIG. 1 shows that a second side of the connector 100 has at least a second side latch generally referred to by reference numeral 120 and a second side ramp generally referred to by reference numeral 124.

The first side latch 118 is flexible, can bend slightly up away from the first side ramp 122, and can bend down slightly toward the first side ramp 122. The first side latch 118 can be made of plastic or other material.

The connector 100 includes at least two pins generally referred to by reference numeral 126, according to the principles disclosed in the subject application. FIG. 1 shows an embodiment wherein the connector 100 has ten pins 126. As shown in FIG. 1, the pins 126 are the same length, are configured to be in two rows, and are configured to be not staggered. The pins 126 can also be referred to as terminals 126.

As shown in FIG. 1, the pins (terminals) 126 extend outward from the front side 110 of the connector 100. In particular, the pins (terminals) 126 extend outward from a rectangular raised unit which is located in a front side recess 112, as shown in FIG. 1.

Different embodiments are possible, in accordance with the principles disclosed in the subject application, wherein the connector 100 can have a number of pins (terminals) other than ten, for example.

FIG. 1 also depicts a body of a printed circuit board (PCB) 200. The printed circuit board 200 has a "U" shaped receiving area 208 for accommodating and receiving the connector 100.

Different embodiments are possible, in accordance with the principles disclosed in the subject application, wherein the printed circuit board 200 can have a number of terminals other than ten, for example.

The printed circuit board 200 forms a first side receiving hole 204 for receiving the first side latch 118 when the connector 100 is engaged with the printed circuit board 200. The printed circuit board 200 also forms a second side receiving hole 206 for receiving the second side latch 120 when the connector 100 is engaged with the printed circuit board 200.

The printed circuit board 200 forms at least one surface mount terminal generally referred to by reference numeral 202, according to the principles disclosed in the subject application.

Figure 2:
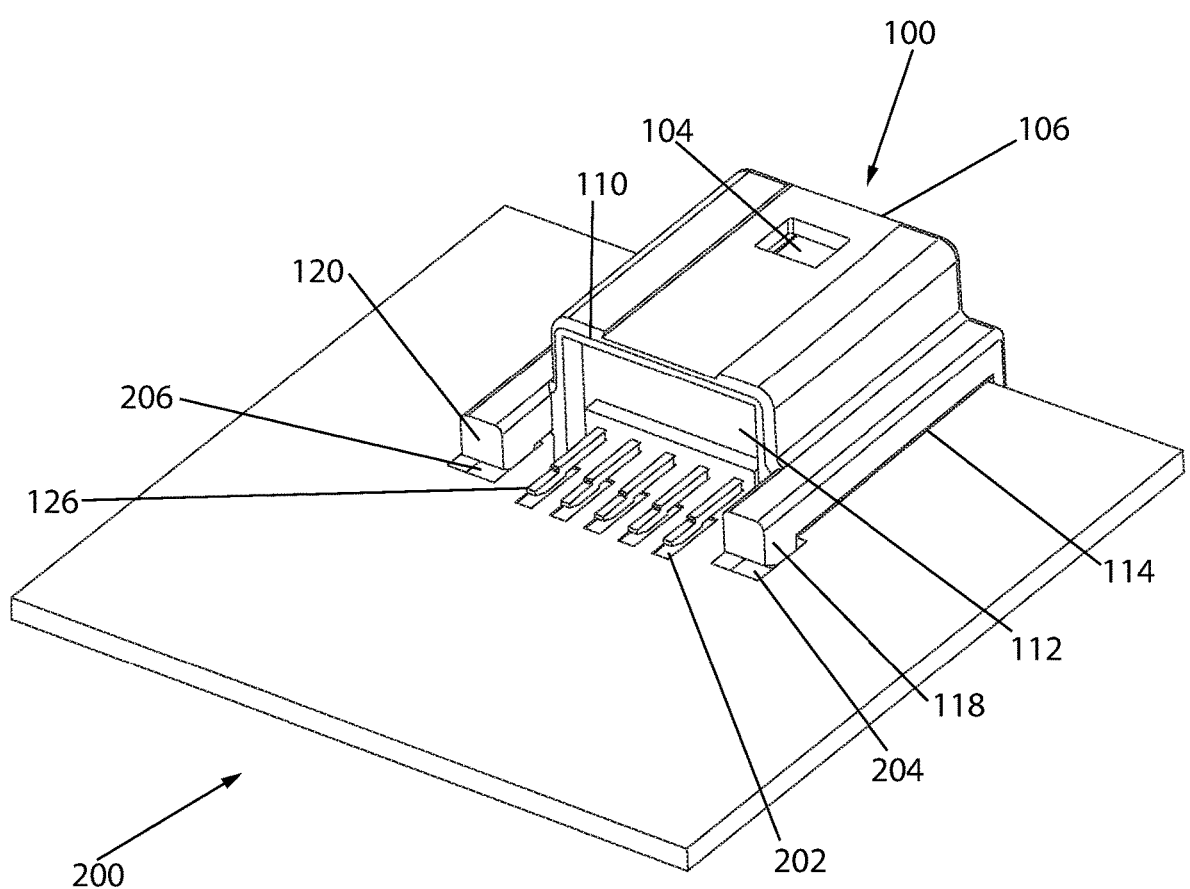
FIG. 2 is a perspective view of the electrical connector apparatus and printed circuit board of FIG. 1, showing the electrical connector apparatus engaged with the printed circuit board, in accordance with the principles disclosed in the subject application.

FIG. 2 is a perspective view of the electrical connector apparatus and printed circuit board of FIG. 1, showing the electrical connector apparatus engaged with the printed circuit board, in accordance with the principles disclosed in the subject application. FIG. 2 shows that the connector 100 is accommodated by the receiving area 208 when the connector 100 is engaged with the printed circuit board 200. Also, FIG. 2 shows that an edge of the printed circuit board 200 is received into the first side slot 114 when the connector 100 is engaged with the printed circuit board 200.

The first side latch 118 of the connector 100 penetrates the first side receiving hole 204 of the printed circuit board 200, when the connector 100 is engaged with the printed circuit board 200, to thereby assist in preventing the connector 100 from being inadvertently disengaged from the printed circuit board 200. The second side latch 120 of the connector 100 penetrates the second side receiving hole 206 of the printed circuit board 200, when the connector 100 is engaged with the printed circuit board 200, to thereby assist in preventing the connector 100 from being inadvertently disengaged from the printed circuit board 200.

The pins (terminals) 126 of the connector 100 contact the surface mount terminals 202, when the connector 100 is engaged with the printed circuit board 200. Each one of the pins (terminals) 126 can be soldered to a respective one of the surface mount terminals 202.

Figure 3:
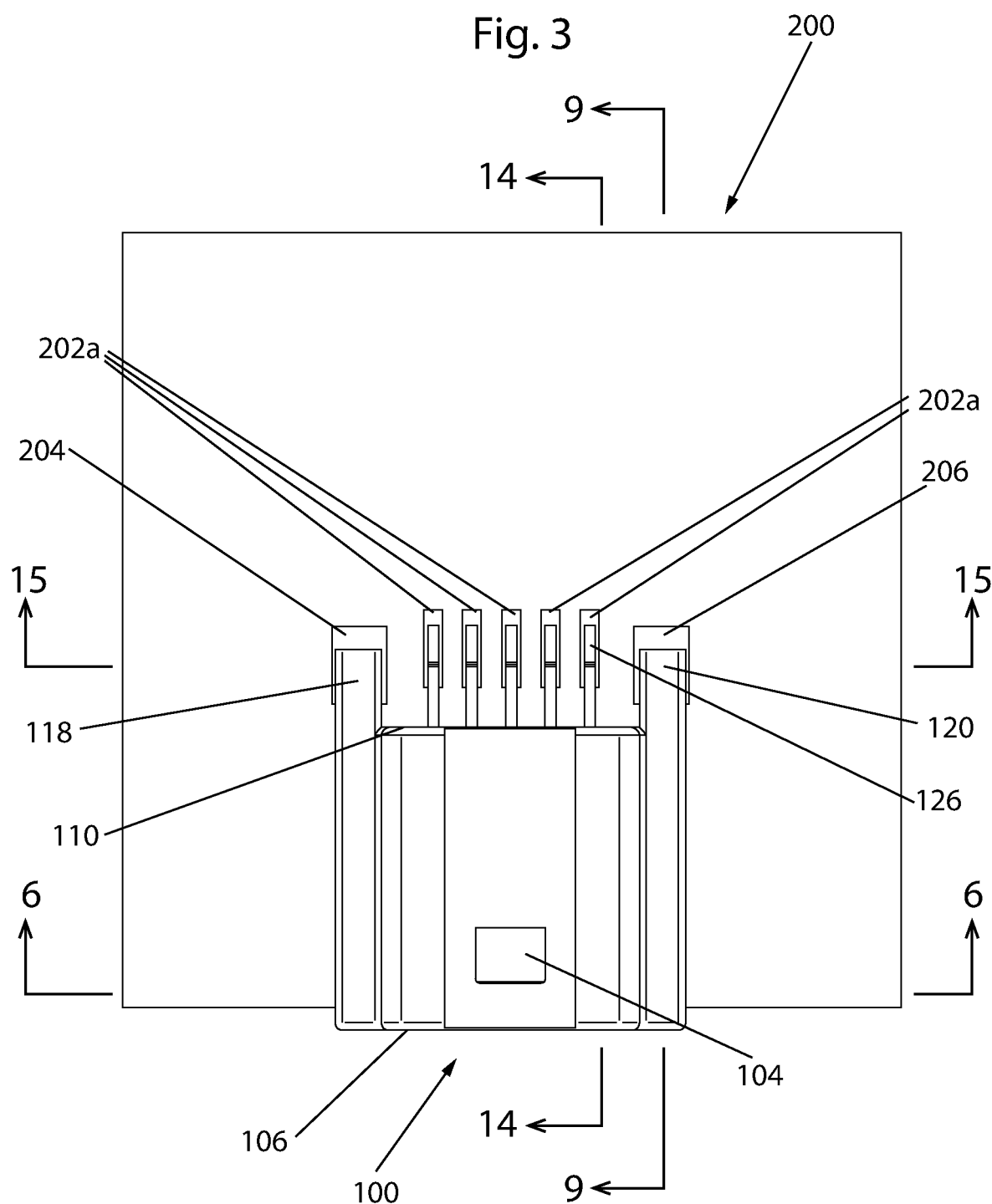
FIG. 3 is a top side elevational view of the electrical connector apparatus and printed circuit board of FIG. 2, in accordance with the principles disclosed in the subject application.

FIG. 3 is a top side elevational view of the electrical connector apparatus and printed circuit board of FIG. 2, in accordance with the principles disclosed in the subject application. FIG. 3 shows a top side of the connector 100 and a top side of the printed circuit board 200. FIG. 3 depicts five surface mount terminals 204a formed on the top side of the printed circuit board 200.

Figure 4:
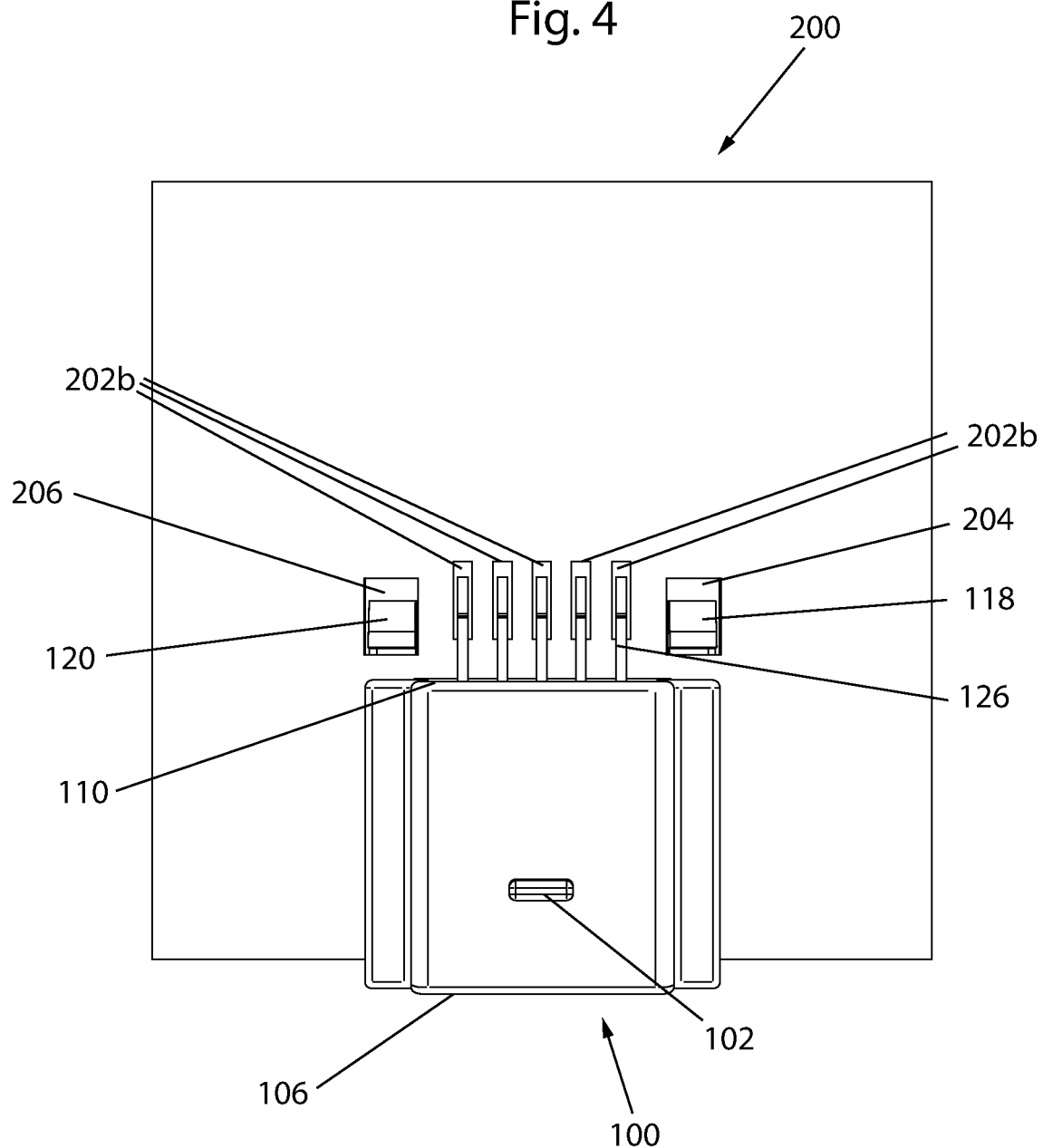
FIG. 4 is a bottom side elevational view of the electrical connector apparatus and printed circuit board of FIG. 2, in accordance with the principles disclosed in the subject application.

FIG. 4 is a bottom side elevational view of the electrical connector apparatus and printed circuit board of FIG. 2, in accordance with the principles disclosed in the subject application. FIG. 4 shows a bottom side of the connector 100 and a bottom side of the printed circuit board 200. A bottom side protrusion 102 is shown on the bottom side of the connector 100. FIG. 4 depicts five surface mount terminals 204b formed on the bottom side of the printed circuit board 200.

FIG. 3 shows that there are five surface mount terminals 202a on a top side of the printed circuit board 200, and FIG. 4 shows that there are five surface mount terminals 202b on a bottom side of the printed circuit board 200, for a total of ten surface mount terminals. Different embodiments are available, in accordance with the principles disclosed in the subject application, wherein the printed circuit board 200 has a number of surface mount terminals other than ten.

Figure 5:
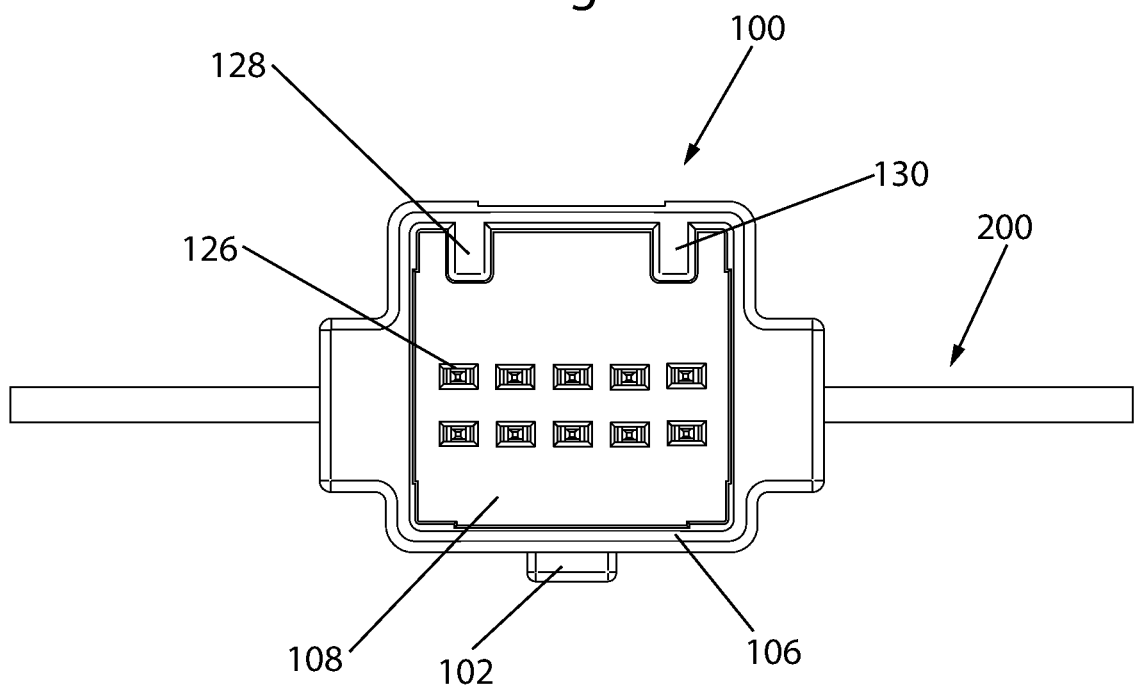
FIG. 5 is a rear side elevational view of the electrical connector apparatus and printed circuit board of FIG. 2, in accordance with the principles disclosed in the subject application.

FIG. 5 is a rear side elevational view of the electrical connector apparatus and printed circuit board of FIG. 2, in accordance with the principles disclosed in the subject application. FIG. 5 shows a rear side interior space 108 at the rear side of the connector 100, which can accommodate an additional connector (not shown). FIG. 5 also shows a first side interior protrusion 128 and a second side interior protrusion 130 inside the rear side interior space 108. As shown in FIG. 5, the pins (terminals) 126 extend in a rearward direction into the rear side interior space 108.

Figure 6:
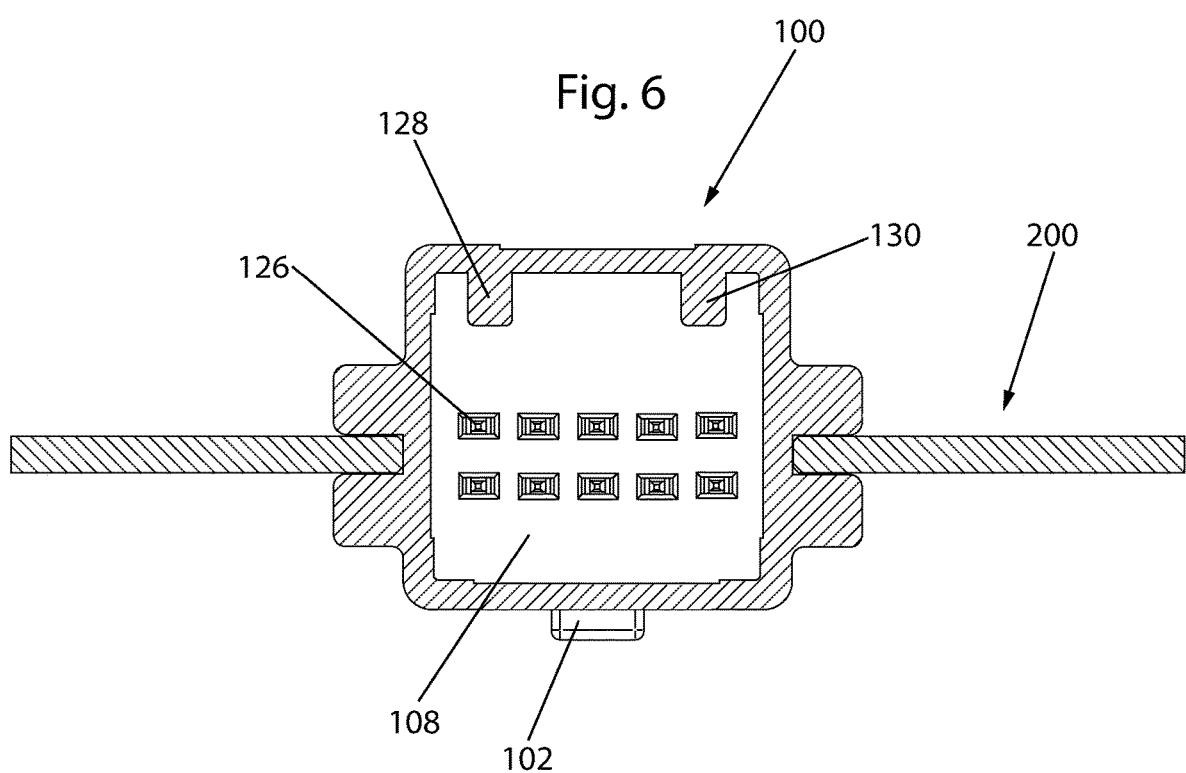
FIG. 6 is a cross-sectional view, taken along line 6-6 in FIG. 3.
Figure 7:
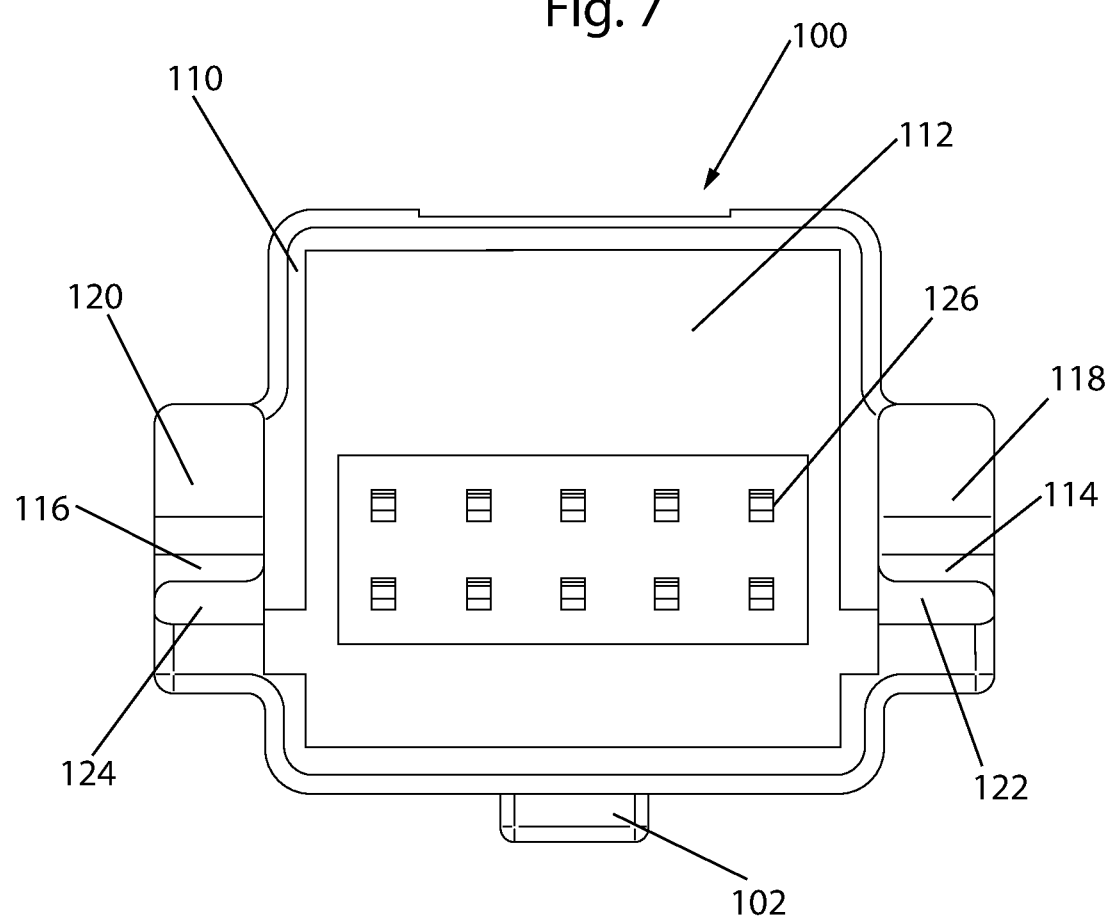
FIG. 7 is a front side elevational view of the electrical connector apparatus of FIG. 1, in accordance with the principles disclosed in the subject application.

FIG. 6 is a cross-sectional view, taken along line 6-6 in FIG. 3. FIG. 7 is a front side elevational view of the electrical connector apparatus of FIG. 1, in accordance with the principles disclosed in the subject application. FIG. 7 shows that a first side slot 114, first side latch 118, and first side ramp 122 are on a first side of the connector 100. FIG. 7 also shows that a second side slot 116, second side latch 120, and second side ramp 124 are on a second side of the connector 100. The second side ramp 124 is formed at an entrance to the second side slot 116.

The second side latch 120 is flexible, can bend slightly up away from the second side ramp 124, and can bend down slightly toward the second side ramp 124. The second side latch 120 can be made of plastic or other material.

Figure 8:
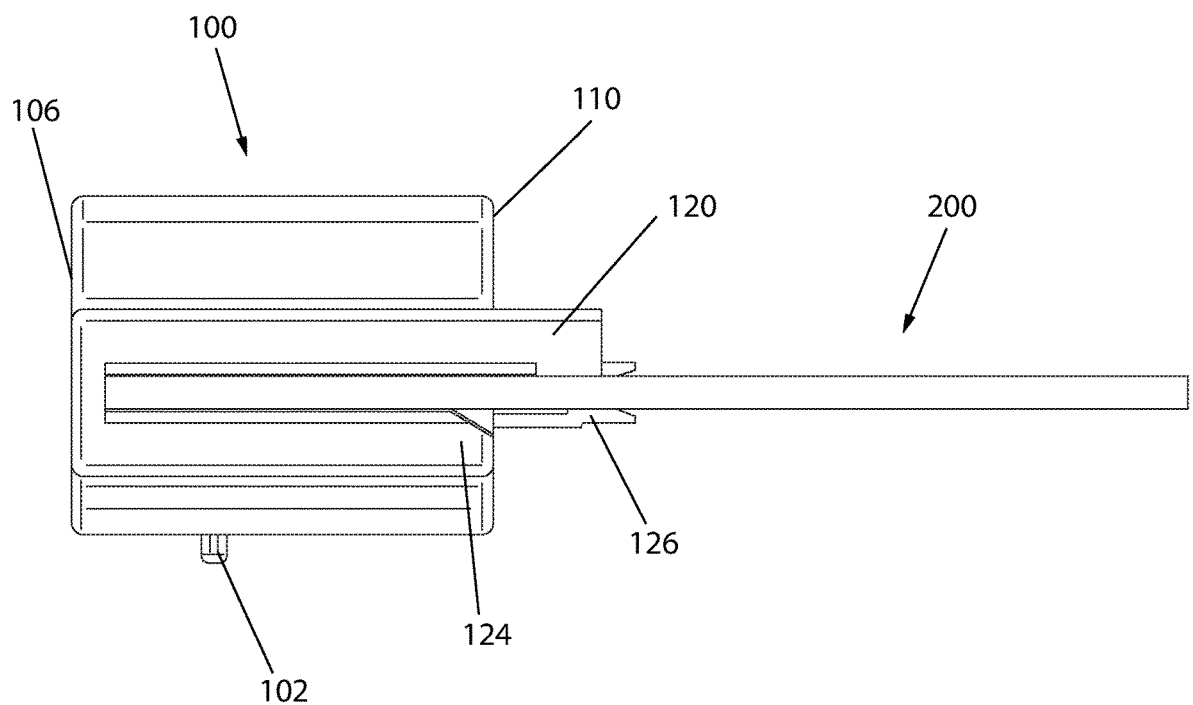
FIG. 8 is a second side elevational view of the electrical connector apparatus and printed circuit board of FIG. 2, in accordance with the principles disclosed in the subject application.
Figure 9:
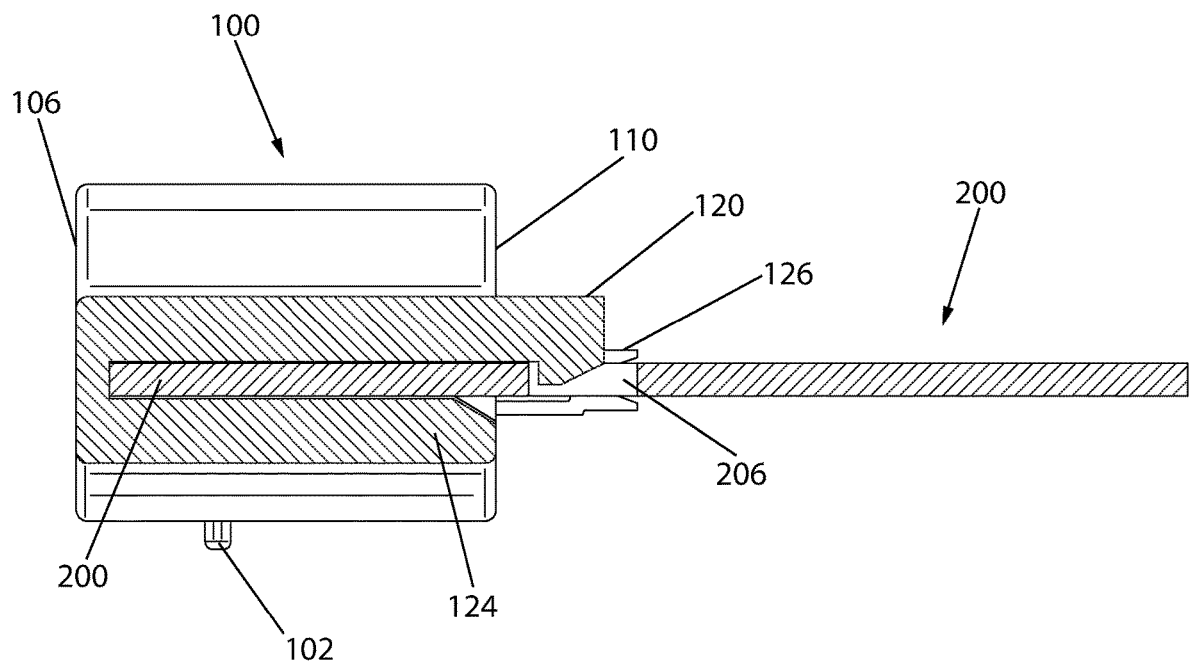
FIG. 9 is a cross-sectional view, taken along line 9-9 in FIG. 3.

FIG. 8 is a second side elevational view of the electrical connector apparatus and printed circuit board of FIG. 2, in accordance with the principles disclosed in the subject application. FIG. 9 is a cross-sectional view, taken along line 9-9 in FIG. 3.

Figure 10:
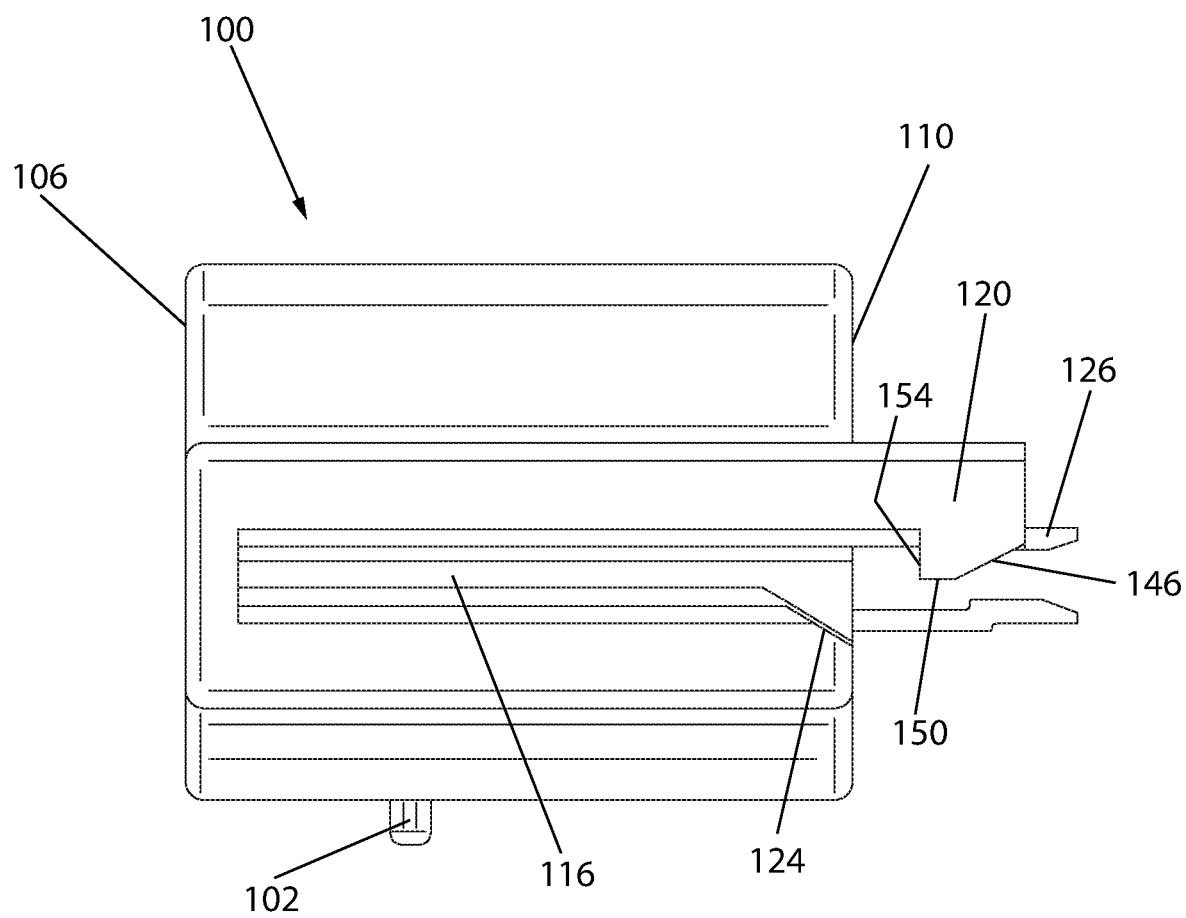
FIG. 10 is a second side elevational view of the electrical connector apparatus of FIG. 1, in accordance with the principles disclosed in the subject application.

FIG. 10 is a second side elevational view of the electrical connector apparatus of FIG. 1, in accordance with the principles disclosed in the subject application. FIG. 10 depicts a second side latch front incline 146, a second side latch bottom edge 150, and a second side latch rear face 154.

As shown in FIG. 10, the second side latch front incline 146 extends downward and partially blocks an entrance to the second side slot 116. With reference to FIGS. 8, 9, 10, and 12, it can be seen that the second side latch front incline 146 and second side latch bottom edge 150 must be pushed upward to permit an edge of the printed circuit board 200 to enter the second side slot 116 deep enough to touch the second side connecting wall 142.

Figure 11:
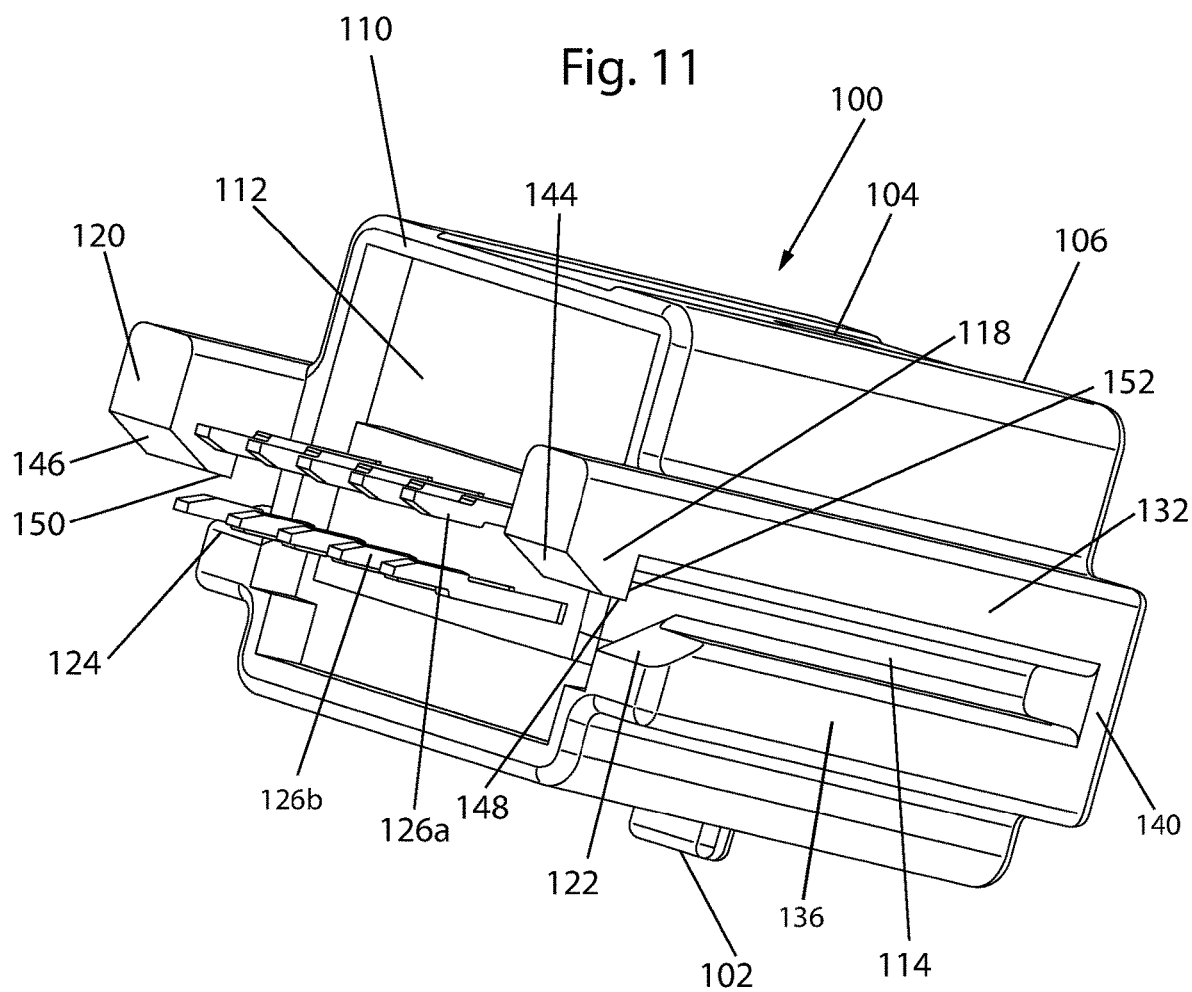
FIG. 11 is a perspective view of the electrical connector apparatus of FIG. 1, in accordance with the principles disclosed in the subject application.

Similarly, the first side latch front incline 144 extends downward and partially blocks an entrance to the first side slot 114, and, with reference to FIGS. 1, 2, and 11, it can be seen that the first side latch front incline 144 and first side latch bottom edge 148 must be pushed upward to permit an edge of the printed circuit board 200 to enter the first side slot 114 deep enough to touch the first side connecting wall 140.

FIG. 11 is a perspective view of the electrical connector apparatus of FIG. 1, in accordance with the principles disclosed in the subject application. FIG. 11 shows ten pins (terminals) 126 on the connector 100.

FIG. 11 depicts a first side latch front incline 144, a first side latch bottom edge 148, and a first side latch rear face 152. As shown in FIG. 11, the ten pins 126 include a first group of five pins 126a and a second group of five pins 126b. The first group of pins 126a is in an upper row, as shown in FIG. 11. The upper row is nearer to the top side of the connector 100. The top side aperture 104 is formed on the top side of the connector 100. The second group of pins 126b is in a lower row, as shown in FIG. 11. The lower row is nearer to the bottom side of the connector 100. The bottom side protrusion 102 is formed on the bottom side of the connector 100.

A first side upper arm 132 and a first side lower arm 136 are located on the first side of the connector 100, as shown in FIG. 11. The first side upper arm 132 has a front end near the front side 110 and a rear end near the rear side 106. The first side lower arm 136 has a front end near the front side 110 and a rear end near the rear side 106.

The first side slot 114 is disposed between the first side upper arm 132 and the first side lower arm 136, as shown in FIG. 11. The front end of the first side upper arm 132 is spaced apart from the front end of the first side lower arm 136. The rear end of the first side upper arm 132 is connected to the rear end of the first side lower arm 136 by a first side connecting wall 140. The first side connecting wall 140 prevents an edge of the printed circuit board 200 from proceeding too far into the first side slot 114.

As shown in FIG. 2, the connector 100 is engaged with the printed circuit board 200, part of the printed circuit board 200 is in the first side slot 114, and an edge of the printed circuit board 200 is touching the first side connecting wall 140 near the rear side 106.

The first side latch 118 is at the front end of the first side upper arm 132. The first side upper arm 132 is on the first side of the connector 100. The first side upper arm 132 extends along and above the first side slot 114.

The first side ramp 122 is at the front end of the first side lower arm 136. The first side lower arm 136 is on the first side of the connector 100. The first side lower arm 136 extends along and below the first side slot 114.

Figure 12:
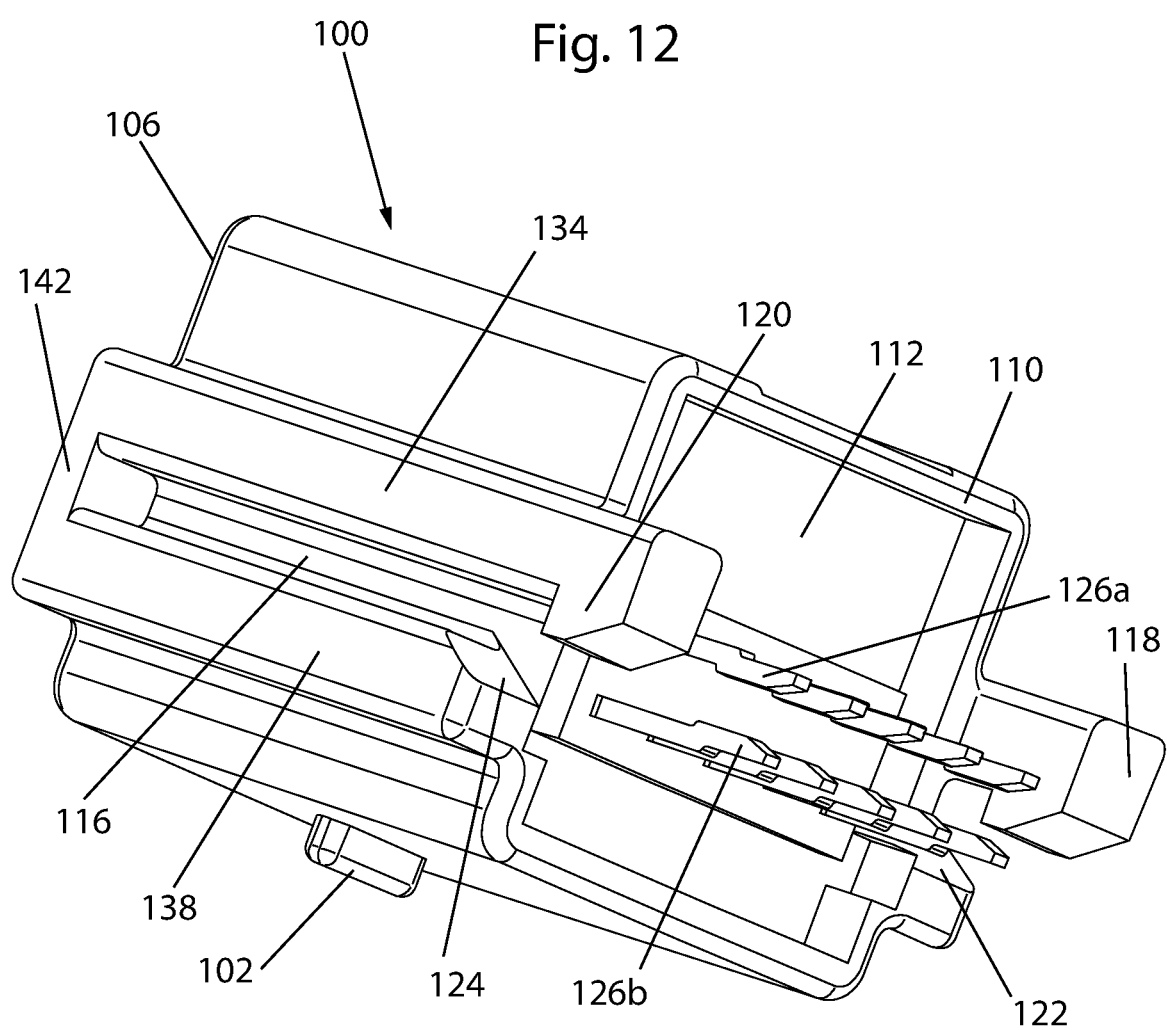
FIG. 12 is a perspective view of the electrical connector apparatus of FIG. 1, in accordance with the principles disclosed in the subject application.

FIG. 12 is a perspective view of the electrical connector apparatus of FIG. 1, in accordance with the principles disclosed in the subject application. FIG. 12 shows that the pins (terminals) 126 extend outward from a rectangle-shaped raised unit which is located in the front side recess 112.

A part of the printed circuit board 200 is received into the second side slot 116 (shown in FIGS. 7, 10, and 12, for example), when the connector 100 is engaged with the printed circuit board 200.

A second side upper arm 134 and a second side lower arm 138 are located on the second side of the connector 100, as shown in FIG. 12. The second side upper arm 134 has a front end near the front side 110 and a rear end near the rear side 106. The second side lower arm 138 has a front end near the front side 110 and a rear end near the rear side 106.

The second side slot 116 is disposed between the second side upper arm 134 and the second side lower arm 138. The front end of the second side upper arm 134 is spaced apart from the front end of the second side lower arm 138. The rear end of the second side upper arm 134 is connected to the rear end of the second side lower arm 138 by a second side connecting wall 142.

The second side connecting wall 142 prevents an edge of the printed circuit board 200 from proceeding too far into the second side slot 116. As shown in FIGS. 8 and 9, the connector 100 is engaged with the printed circuit board 200, a part of the printed circuit board 200 is in the second side slot 116, and an edge of the printed circuit board 200 is touching the second side connecting wall 142 near the rear side 106.

The second side latch 120 is at the front end of the second side upper arm 134. The second side upper arm 134 is on the second side of the connector 100. The second side upper arm 134 extends along and above the second side slot 116.

The second side ramp 124 is at the front end of the second side lower arm 138. The second side lower arm 138 is on the second side of the connector 100. The second side lower arm 138 extends along and below the second side slot 116.

Figure 13:
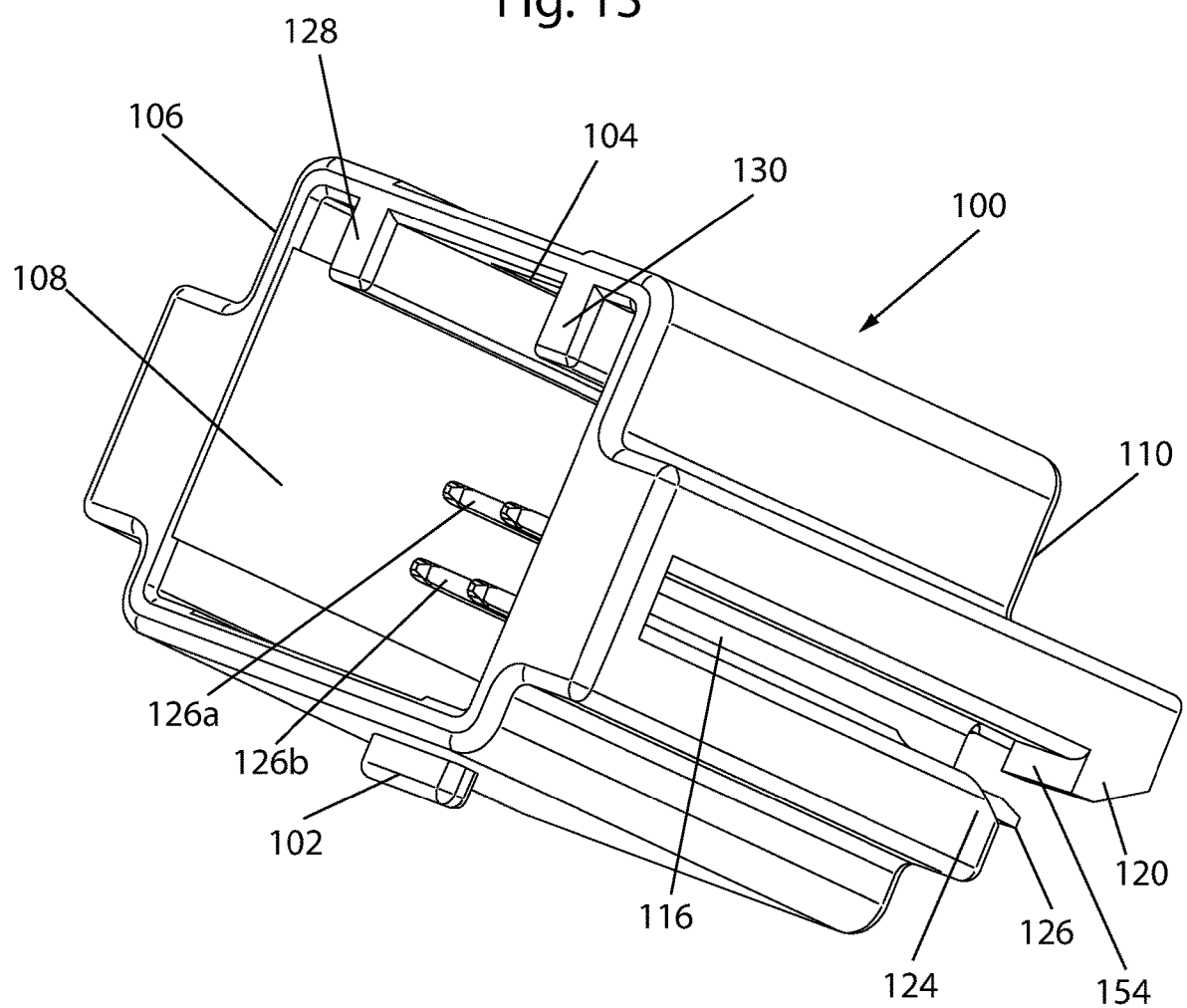
FIG. 13 is a perspective view of the electrical connector apparatus of FIG. 1, in accordance with the principles disclosed in the subject application.
Figure 14:
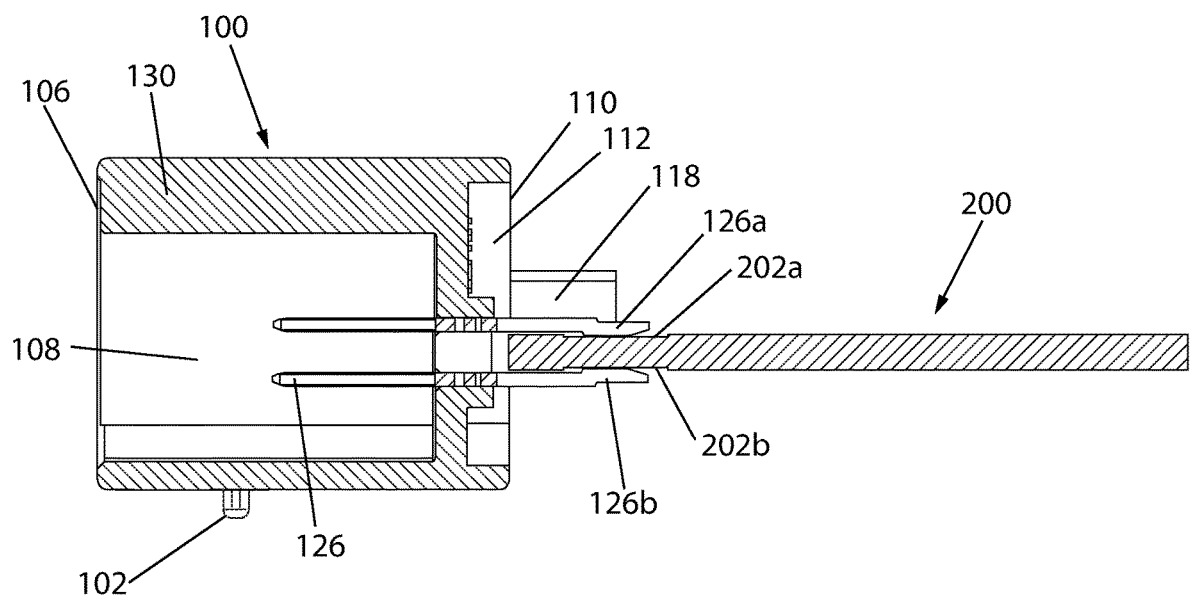
FIG. 14 is a cross-sectional view, taken along line 14-14 in FIG. 3.
Figure 15:
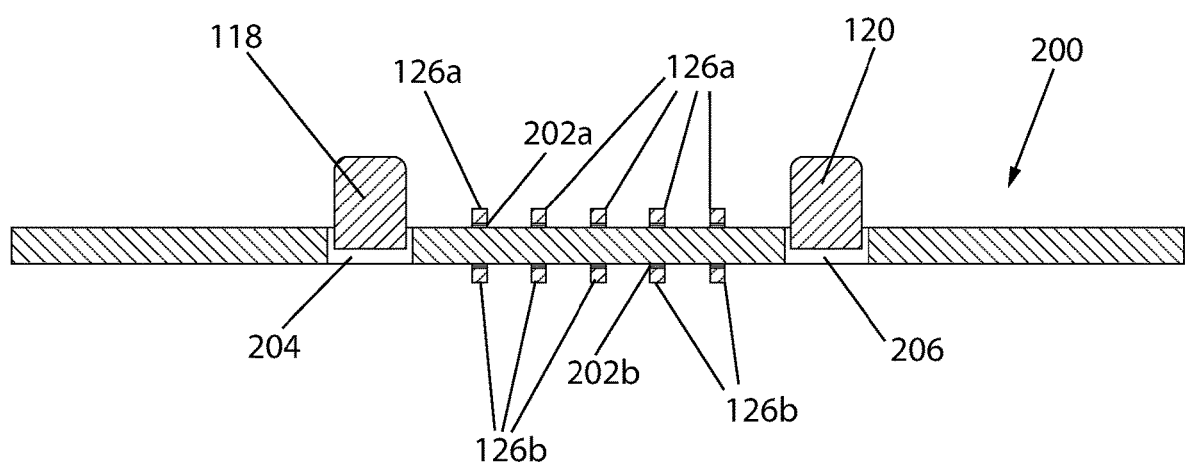
FIG. 15 is a cross-sectional view, taken along line 15-15 in FIG. 3.

FIG. 13 is a perspective view of the electrical connector apparatus of FIG. 1, in accordance with the principles disclosed in the subject application. FIG. 14 is a cross-sectional view, taken along line 14-14 in FIG. 3. FIG. 14 shows that the pins (terminals) 126 extend from the front side 110 of the connector 100 through to the rear side interior space 108 of the connector 100. FIG. 15 is a cross-sectional view, taken along line 15-15 in FIG. 3.

A method for engaging the connector 100 with the printed circuit board 200 is as follows. With reference to FIG. 1, the connector 100 is moved in a forward direction, which is toward the receiving area 208 of the printed circuit board 200.

Initially, a first edge of the printed circuit board 200 is moved toward the first side slot 114 between first side latch 118 and first side ramp 122, and also a second edge of the printed circuit board 200 is moved toward the second side slot 116 between second side latch 120 and second side ramp 124.

The first edge of the printed circuit board 200 contacts the first side latch front incline 144 and thereby pushes the first side latch 118 upward away from the first side ramp 122.

Also, the first edge of the printed circuit board 200 rides up the first side ramp 122, and begins to enter the first side slot 114. The top side of the printed circuit board 200 contacts the first side latch bottom edge 148 and causes the first side latch 118 to be held in an upwardly flexed arrangement while the printed circuit board 200 moves deeper into the first side slot 114 toward the first side connecting wall 140.

The second edge of the printed circuit board 200 contacts the second side latch front incline 146 and thereby pushes the second side latch 120 upward away from the second side ramp 124. Also, the second edge of the printed circuit board 200 rides up the second side ramp 124, and begins to enter the second side slot 116. The top side of the printed circuit board 200 contacts the second side latch bottom edge 150 and causes the second side latch 120 to be held in an upwardly flexed arrangement while the printed circuit board 200 moves deeper into the second side slot 116 toward the second side connecting wall 142.

To assist in physically securing the printed circuit board 200 to the connector 100, the first side latch 118 and second side latch 120 are structurally configured to extend forward, toward the printed circuit board 200, beyond the front side 110 of the connector 100, as shown in FIG. 3, for example.

Next, the connector 100 and the printed circuit board 200 are urged again toward each other, such that: (1) the first edge of the printed circuit board 200 travels between the first side latch 118 and the first side ramp 122, toward the rear side 106 of the connector 100, wherein the first edge of the printed circuit board 200 enters into the first side slot 114; and (2) the second edge of the printed circuit board 200 travels between the second side latch 120 and the second side ramp 124, toward the rear side 106 of the connector 100, wherein the second edge of the printed circuit board 200 enters into the second side slot 116.

To assist in electrically connecting the printed circuit board 200 to the connector 100, the pins (terminals) 126 extend outward at the front side 110 of the connector 100, from an area of the front side recess 112.

When the connector 100 engages with the printed circuit board 200, each one of the pins 126a in the upper row of pins forms an electrical connection with a respective surface mount terminal 202a on the top side of the printed circuit board 200 (see FIGS. 3, 11, and 15).

Also, when the connector 100 engages with the printed circuit board 200, each one of the pins 126b in the lower row of pins forms an electrical connection with a respective surface mount terminal 202b on the bottom side of the printed circuit board 200 (see FIGS. 4, 11, and 15).

The connector 100 is physically secured to the printed circuit board 200 when: the first side latch 118 penetrates the first side receiving hole 204; and the second side latch 120 penetrates the second side receiving hole 206. Also, if the pins 126 are soldered to the surface mount terminals 202, this facilitates physical and electrical connection between the connector 100 and the printed circuit board 200.

A sound, such as a "click" sound, is heard when the first side latch 118 penetrates the first side receiving hole 204. The first side latch rear face 152 is flat and helps to hold the first side latch 118 in the first side receiving hole 204.

A sound, such as a "click" sound, is heard when the second side latch 120 penetrates the second side receiving hole 206. The second side latch rear face 154 is flat and helps to hold the second side latch 120 in the second side receiving hole 206.

When the connector 100 is engaged with the printed circuit board 200, as shown in FIGS. 2 and 14, for example, a portion of at least one pin (terminal) 126a is in contact with a portion of at least one surface mount terminal 202a. The at least one pin (terminal) 126a can be soldered to the at least one surface mount terminal 202a. Furthermore, each pin (terminal) 126 can be soldered to a respective surface mount terminal 202.

As shown in the embodiments depicted in FIGS. 3 and 14, for example, the pins (terminals) 126 extend away from the front side 110 a first distance, and the first side latch 118 extends away from the front side 110 a second distance, wherein the first distance is further than the second distance. However, other embodiments can have structural configurations such that the first side latch 118 extends further from the front side 110 than the pins (terminals) 126, in accordance with the principles disclosed in the subject application.

When the printed circuit board 200 is secured to the connector 100, as shown in FIG. 2, for example, each one of the ten pins (terminals) 126 of the connector 100 is in electrical contact with a respective one of the ten surface mount terminals 202 of the printed circuit board 200.

In accordance with the principles disclosed in the subject application, the connector can engage with a printed circuit board, or other unit, having one or more of the following features: at least one receiving hole; at least two terminals; and at least one edge.

In accordance with the principles disclosed in the subject application, additional embodiments can be described as follows. The connector can engage with a unit that is not a printed circuit board, wherein the unit has one or more of the following features: at least one receiving hole; at least two terminals; and at least one edge. Also, the unit can have various different types of electrically-conductive terminals, and is not limited to only the types of terminals depicted in the drawings.

In accordance with the principles disclosed in the subject application, the connector does not need to have all of the features disclosed in FIG. 11. For example, the connector will still be in accordance with the principles disclosed in the subject application when the connector only has one or more of the following features: at least one latch; at least two pins; and at least one slot.

All components of the connector 100, other than the pins 126, can be made of one or more materials which are insulators, such as plastic for example. The pins 126 can be made of one or more materials which are electrically-conductive, such as metal, for example.

The first side upper arm 132 and first side lower arm 136 can be formed integrally with the body of the connector 100. The second side upper arm 134 and second side lower arm 138 can be formed integrally with the body of the connector 100.

The first side upper arm 132 and first side lower arm 136 can be molded to be one unitary object with the body of the connector 100. The second side upper arm 134 and second side lower arm 138 can be molded to be one unitary object with the body of the connector 100.

FIG. 1 depicts a preferred embodiment wherein a connector 100 has at least two latches 118, 120, at least two slots 114, 116, and at least two pins 126, while a printed circuit board 200 has at least two receiving holes 204, 206, at least two edges each to be received by a respective one of the slots 114, 116, and at least two terminals 202 each to be electrically connected to a respective one of the pins 126.

In a different embodiment, the printed circuit board 200 can be replaced by a unit that is not a printed circuit board, wherein the unit has at least two receiving holes 204, 206, at least two edges each to be received by a respective one of the slots 114, 116, and at least two terminals 202 each to be electrically connected to a respective one of the pins 126, for example.

In a different embodiment, the connector 100 can be formed to have only one latch while the printed circuit board 200, or other unit, can be formed to have only one receiving hole. That is, in a different embodiment, the connector 100 can be formed to have latch 118 and to not have latch 120, while the printed circuit board 200, or other unit, can be formed to have receiving hole 204 and to not have receiving hole 206, for example.

In a different embodiment, the connector 100 can be formed to have only one slot. That is, in a different embodiment, the connector 100 can be formed to have slot 114 and to not have slot 116, for example.

In a different embodiment, the connector 100 can be formed to have more than two latches or more than two slots, or more than two latches and more than two slots. Also, the printed circuit board 200, or other unit, can be formed to have more than two receiving holes or more than two edges being received by slots of the connector 100, or more than two receiving holes and more than two edges being received by slots of the connector 100.

Although the foregoing description is directed to the preferred embodiments of the invention, it is noted that other variations and modifications will be apparent to those skilled in the art, and may be made without departing from the spirit or scope of the principles disclosed in the subject application. Moreover, features described in connection with one embodiment of the invention may be used in conjunction with other embodiments, even if not explicitly stated above.

LIST OF REFERENCE NUMERALS

100 Connector
102 Bottom side protrusion
104 Top side aperture
106 Rear side
108 Rear side interior space
110 Front side
112 Front side recess
114 First side slot
116 Second side slot
118 First side latch
120 Second side latch
122 First side ramp
124 Second side ramp
126 Pin
126a Upper row pin
126b Lower row pin
128 First side interior protrusion
130 Second side interior protrusion
132 First side upper arm
134 Second side upper arm
136 First side lower arm
138 Second side lower arm
140 First side connecting wall
142 Second side connecting wall
144 First side latch front incline
146 Second side latch front incline
148 First side latch bottom edge
150 Second side latch bottom edge
152 First side latch rear face
154 Second side latch rear face
200 Printed circuit board
202 Surface mount terminal
202a Top side surface mount terminal
202b Bottom side surface mount terminal
204 First side receiving hole
206 Second side receiving hole
208 Receiving area

We claim:

1. An electrical connector, comprising:
at least two latches, wherein at least one of the latches is flexible;
a plurality of conductive pins, wherein the pins are in two rows; and
at least two slots including a first slot and a second slot, wherein a printed circuit board having at least two receiving holes, a plurality of terminals, and at least two edges, is secured to the electrical connector when each of the at least two latches is received by a respective one of the two receiving holes, each of the conductive pins is in electrical contact with a respective one of the terminals, each of the at least two edges is received by a respective one of the two slots, at least one of the slots is formed on an exterior of the electrical connector, and at least one of the receiving holes is spaced apart from sides of the printed circuit board.

2. The electrical connector according to claim 1, wherein a "click" sound is emitted when at least one of the latches is received by at least one of the receiving holes.

3. The electrical connector according to claim 1, wherein the pins are not staggered.

4. The electrical connector according to claim 1, wherein the terminals are surface mount terminals.

5. The electrical connector according to claim 1, wherein at least one of the latches partially blocks at least one of the slots.

6. The electrical connector according to claim 1, wherein at least one of the slots is on a side of the electrical connector.

7. The electrical connector according to claim 1, wherein at least one of the pins extends from a body of the electrical connector a first distance, and at least one of the latches extends from the body of the electrical connector a second distance less than the first distance.

8. The electrical connector according to claim 1, further comprising:
a first upper arm; and
a first lower arm, wherein the first slot is formed between the first upper arm and the first lower arm.

9. A connector, comprising:
at least one latch, wherein the at least one latch is flexible;
at least one slot; and
at least two pins, wherein the pins are in two rows, the at least one latch is received into a hole formed by a unit, the at least one slot receives an edge of the unit, each of the at least two pins is in contact with a respective terminal of the unit, at least one of the two pins extends a first distance from a body of the connector, the at least one latch extends a second distance from the body of the connector, the second distance being not equal to the first distance, at least one of the slots is formed on an exterior of the connector, and at least one of the receiving holes is spaced apart from sides of the unit.

10. The connector according to claim 9, wherein the terminals are surface mount terminals.

11. The connector according to claim 9, wherein the at least one latch partially blocks the at least one slot.

12. The connector according to claim 9, wherein a "click" sound is emitted when the at least one latch is received into the hole.

13. The connector according to claim 9, wherein a ramp is formed at an entrance to the at least one slot.

14. The connector according to claim 9, wherein the pins are not staggered.

15. A printed circuit board configured to be coupled to a connector,
the printed circuit board comprising:
 at least one receiving hole;
 at least one edge; and
 at least two conductive terminals,
the connector comprising:
 a latch being flexible; and
 at least a first pin and a second pin extending a first distance from the connector,
wherein the printed circuit board is coupled to the connector when the latch of the connector is received by the at least one receiving hole, wherein the first and second pins are in two rows, the latch extends a second distance from the connector, the second distance being not equal to the first distance, at least one of the slots is formed on an exterior of the connector, and at least one of the receiving holes is spaced apart from sides of the printed circuit board.

16. The printed circuit board configured to be coupled to the connector according to claim 15, wherein the connector further comprises at least two slots, wherein the connector is secured to the printed circuit board when the latch is received by the at least one receiving hole and the first and second pins are in electrical contact with respective ones of the at least two conductive terminals.

17. The printed circuit board configured to be coupled to the connector according to claim 15, wherein the connector further comprises at least one slot, and is engaged to the printed circuit board when the at least one slot receives the at least one edge.

18. The printed circuit board configured to be coupled to the connector according to claim 15, wherein the connector is engaged to the printed circuit board when the first pin is in electrical contact with at least one of the conductive terminals.

19. The printed circuit board configured to be coupled to the connector according to claim 15, wherein the at least two conductive terminals are surface mount terminals.

20. The printed circuit board configured to be coupled to the connector according to claim 15, wherein the at least two conductive terminals are not staggered.

* * * * *